(12) United States Patent
Kim et al.

(10) Patent No.: US 12,282,427 B2
(45) Date of Patent: *Apr. 22, 2025

(54) METHOD AND APPARATUS FOR ADAPTIVELY MANAGING CACHE POOL

(71) Applicant: XCENA Inc., Seongnam-si (KR)

(72) Inventors: Dohun Kim, Yongin-si (KR); Jinyeong Kim, Yongin-si (KR); Juhyun Kim, Yongin-si (KR)

(73) Assignee: XCENA Inc., Seongnam-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/655,715

(22) Filed: May 6, 2024

(65) Prior Publication Data
US 2024/0289274 A1 Aug. 29, 2024

Related U.S. Application Data

(63) Continuation of application No. 18/504,966, filed on Nov. 8, 2023, now Pat. No. 12,007,893.

(30) Foreign Application Priority Data

Jan. 10, 2023 (KR) .......................... 10-2023-0003461

(51) Int. Cl.
*G06F 12/00* (2006.01)
*G06F 12/0802* (2016.01)
*G06F 30/27* (2020.01)

(52) U.S. Cl.
CPC .......... *G06F 12/0802* (2013.01); *G06F 30/27* (2020.01); *G06F 2212/60* (2013.01)

(58) Field of Classification Search
CPC .. G06F 12/0802; G06F 30/27; G06F 2212/60; G06F 16/22; G06F 16/31; G06F 16/901
See application file for complete search history.

(56) References Cited

U.S. PATENT DOCUMENTS

| 2004/0133747 | A1* | 7/2004 | Coldewey ........... G06F 12/0862 711/137 |
| 2005/0038962 | A1 | 2/2005 | Lim |
| 2010/0095068 | A1 | 4/2010 | Shimizuno et al. |

(Continued)

FOREIGN PATENT DOCUMENTS

| JP | 2015-036873 A | 2/2015 |
| KR | 10-2005-0018255 A | 2/2005 |

(Continued)

OTHER PUBLICATIONS

"Request for the Submission of an Opinion" Office Action issued in KR 10-2023-0003461; mailed by the Korean Intellectual Property Office on Mar. 20, 2023.

(Continued)

*Primary Examiner* — Shawn X Gu
(74) *Attorney, Agent, or Firm* — Studebaker Brackett PLLC

(57) ABSTRACT

Provided is a method for managing an adaptive cache pool, which is performed by one or more processors, and includes receiving monitoring information on a cache memory divided into a plurality of cache pools, and adjusting a cache region associated with at least one of the plurality of cache pools based on the monitoring information.

9 Claims, 11 Drawing Sheets

(56) References Cited

U.S. PATENT DOCUMENTS

| | | | |
|---|---|---|---|
| 2015/0052314 A1 | 2/2015 | Fujii et al. | |
| 2017/0285986 A1* | 10/2017 | Gopal | G06F 12/0897 |
| 2021/0358548 A1 | 11/2021 | Pawlowski | |
| 2022/0058132 A1* | 2/2022 | Roberts | G06F 12/0862 |
| 2022/0350742 A1 | 11/2022 | Lee et al. | |

FOREIGN PATENT DOCUMENTS

| | | |
|---|---|---|
| KR | 10-2010-0006584 A | 1/2010 |
| KR | 10-2022-0054366 A | 5/2022 |
| KR | 10-2022-0149100 A | 11/2022 |

OTHER PUBLICATIONS

"Written Decision on Registration" Office Action issued in KR 10-2023-0003461; mailed by the Korean Intellectual Property Office on Jul. 25, 2023.

* cited by examiner

FIG. 4
| CACHE POOL ID | ADDRESS RANGE |
|---|---|
| P0 | addr#1 ~ addr#10000 |
| P1 | addr#10001 ~ addr#20000 |
| P2 | addr#20001 ~ addr#30000 |
| P3 | addr#30001 ~ addr#40000 |
410
t1
| CACHE POOL ID | ADDRESS RANGE |
|---|---|
| P0 | addr#1 ~ addr#5000 |
| P1 | addr#5001 ~ addr#20000 |
| P2 | addr#20001 ~ addr#30000 |
| P3 | addr#30001 ~ addr#40000 |
420
t2
| CACHE POOL ID | ADDRESS RANGE |
|---|---|
| P0 | addr#1 ~ addr#5000 |
| P1 | addr#5001 ~ addr#20000 |
| P2 | addr#20001 ~ addr#25000 |
| P3 | addr#25001 ~ addr#40000 |
430

FIG. 5
| CACHE POOL ID | ADDRESS RANGE |
|---|---|
| P0 | addr#1 ~ addr#10000 |
| P1 | addr#10001 ~ addr#20000 |
| P2 | addr#20001 ~ addr#30000 |
| P3 | addr#30001 ~ addr#40000 |
510
t1
| CACHE POOL ID | ADDRESS RANGE |
|---|---|
| P0 | addr#1 ~ addr#5000 |
| P1 | addr#10001 ~ addr#20000 |
| P2 | addr#20001 ~ addr#30000 |
| P3 | addr#5001 ~ addr#10000<br>addr#30001 ~ addr#40000 |
520
t2
| CACHE POOL ID | ADDRESS RANGE |
|---|---|
| P0 | addr#1 ~ addr#5000 |
| P1 | addr#10001 ~ addr#15000 |
| P2 | addr#15001 ~ addr#30000 |
| P3 | addr#5001 ~ addr#10000<br>addr#30001 ~ addr#40000 |
530

FIG. 6

| CACHE POOL ID | ADDRESS RANGE | ALLOCATION CAPACITY |
|---|---|---|
| P0 | addr#1 ~ addr#10000 | 1Mbyte |
| P1 | addr#10001 ~ addr#20000 | 1Mbyte |
| P2 | addr#20001 ~ addr#30000 | 1Mbyte |
| P3 | addr#30001 ~ addr#40000 | 1Mbyte |

610

 t1

| CACHE POOL ID | ADDRESS RANGE | ALLOCATION CAPACITY |
|---|---|---|
| P0 | addr#1 ~ addr#5000 | 0.5Mbyte |
| P1 | addr#5001 ~ addr#20000 | 1.5Mbyte |
| P2 | addr#20001 ~ addr#30000 | 1Mbyte |
| P3 | addr#30001 ~ addr#40000 | 1Mbyte |

620

 t2

| CACHE POOL ID | ADDRESS RANGE | ALLOCATION CAPACITY |
|---|---|---|
| P0 | addr#1 ~ addr#5000 | 0.5Mbyte |
| P1 | addr#5001 ~ addr#20000 | 1.5Mbyte |
| P2 | addr#20001 ~ addr#25000 | 0.5Mbyte |
| P3 | addr#25001 ~ addr#40000 | 1.5Mbyte |

630

METHOD AND APPARATUS FOR ADAPTIVELY MANAGING CACHE POOL

CROSS-REFERENCE TO RELATED APPLICATION

This application is a continuation application of U.S. patent application Ser. No. 18/504,966, which claims priority under 35 U.S.C § 119 to Korean Patent Application No. 10-2023-0003461, filed in the Korean Intellectual Property Office on Jan. 10, 2023, the entire contents of which are hereby incorporated by reference.

TECHNICAL FIELD

The present disclosure relates to a method for managing a cache pool, and more specifically, to a method and apparatus for adaptively managing a cache pool based on monitoring information on a cache memory.

BACKGROUND

Cache memory is a memory device that operates at high speed to improve the processing performance of the processor. The processor first accesses data stored in the cache memory at high speed, but accesses data stored in the main memory if required data is not stored in the cache memory. If the processor successfully retrieves required data from the cache memory, this is called a "cache hit". On the other hand, if the processor fails to retrieve required data from the cache memory and retrieves it from the main memory, this is called a "cache miss". The percentage of cache hits is a "cache hit-rate", and the cache hit-rate is used as an important indicator for determining cache performance.

Meanwhile, a cache used in a general-purpose processor is generally configured in a set-associative manner. The set-associative manner is designed on the premise that access probabilities to memory addresses are the same.

However, if a specific application is running and a plurality of different workloads are generated in the specific application, access probabilities to memory addresses may be different for each workload. In this case, the first cache hit-rate generated by the first workload may be different from the second cache hit-rate generated by the second workload. For example, the first cache hit-rate generated by the first workload may be higher or lower than the second cache hit-rate generated by the second workload.

If the cache hit-rate generated by the specific workload is lowered, the processing speed of the process associated with the workload is lowered, and thus the operating speed of the specific application may also be lowered.

SUMMARY

The present disclosure provides a method, a computer program stored in a recording medium, and an apparatus (system) for managing an adaptive cache pool.

The present disclosure may be implemented in a variety of ways, including methods, apparatus (systems) and/or non-transitory computer readable storage media storing instructions.

A method for managing an adaptive cache pool may be performed by a processor and include receiving monitoring information on a cache memory divided into a plurality of cache pools, and adjusting a cache region associated with at least one of the plurality of cache pools based on the monitoring information.

A method for managing an adaptive cache pool may be performed by a processor and include receiving monitoring information on a cache memory divided into a plurality of cache pools, adjusting a cache region associated with at least one of the plurality of cache pools based on the monitoring information, in which each of the plurality of cache pools may be allocated a different workload, each workload may be associated with a different data structure, and the adjusting the cache region may include estimating a memory access pattern for each workload associated with the different data structure based on the monitoring information, and adjusting the cache region associated with at least one of the plurality of cache pools based on the estimated memory access pattern for each workload.

The monitoring information may include at least one of an access log to an address associated with each of a plurality of cache pools, or a cache hit-rate.

The adjusting the cache region may include estimating a memory access pattern for each of the plurality of workloads based on the monitoring information, and adjusting the cache region associated with at least one of the plurality of cache pools based on the estimated memory access pattern for each of the plurality of workloads.

The memory access pattern for each of the plurality of workloads may be estimated by inputting at least some of the monitoring information to a machine learning model.

The estimating the memory access pattern may include estimating an access probability or frequency for each main memory address for each of the plurality of workloads based on at least some of the monitoring information.

The adjusting the cache region may include determining a target cache pool to change a cache region based on the estimated memory access pattern for each of the plurality of workloads, and changing a main memory address associated with the determined target cache pool.

The adjusting the cache region may include determining a target cache pool to change a cache region based on the estimated memory access pattern for each of the plurality of workloads, and changing a cache memory capacity allocated to the determined target cache pool.

The plurality of workloads may be workloads associated with different data structures.

The cache region associated with the plurality of cache pools may be adjusted such that different data structures are associated with different cache pools.

The monitoring information for the cache memory may be received periodically or aperiodically, and the cache region associated with the plurality of cache pools may be adjusted periodically or aperiodically using the received monitoring information.

An adaptive cache pool management method may include, prior to receiving the monitoring information, acquiring a type of an application requested to be executed, and dividing the cache memory into the plurality of cache pools based on the type of the application.

A computer-readable non-transitory recording medium recording instructions for executing, on a computer, the adaptive cache pool management method described above may be provided.

A computing device is provided, which may include a cache memory, and a processor connected to the cache memory and configured to execute at least one computer readable program for controlling the cache memory, in which the at least one computer-readable program may include instructions for receiving monitoring information on a cache memory divided into a plurality of cache pools, and adjusting a cache region associated with at least one of the plurality of cache pools based on the monitoring information.

According to some examples of the present disclosure, a cache memory is divided into a plurality of cache pools, and each of the plurality of divided cache pools may be associated with a different workload (data structure). A cache region associated with at least one of the plurality of cache pools may be adaptively adjusted based on the monitoring information on the cache memory such that a cache hit-rate by each workload (data structure) increases. Accordingly, the overall cache hit-rate of each divided cache pool can be improved, and also the application operation speed can be improved.

According to some examples of the present disclosure, adjustment of the cache pool may be performed periodically or aperiodically. Accordingly, the cache pool can be adaptively adjusted in accordance with changed environment when the operating environment of the application changes.

According to some examples of the present disclosure, the monitoring information on the cache memory may be applied to the machine learning model to accurately estimate the memory access pattern for each of a plurality of workloads.

According to some examples of the present disclosure, each workload may be configured to be associated with a different data structure, and the workload associated with a specific data structure may be associated with a specific cache pool. Accordingly, a plurality of cache pools associated with each data structure can secure independent cache regions so as not to interfere with each other, and cache hit-rates can be maximized by this independent cache pool environment.

According to some examples of the present disclosure, the cache memory may be divided into a plurality of cache pools having different cache regions immediately before or after execution of the application, based on the type of application requested to be executed. Accordingly, a cache miss occurring at an early stage of application execution can be minimized.

The effects of the present disclosure are not limited to the effects described above, and other effects not described herein can be clearly understood by those of ordinary skill in the art (referred to as "ordinary technician") from the description of the claims.

BRIEF DESCRIPTION OF THE DRAWINGS

The above and other objects, features and advantages of the present disclosure will be described with reference to the accompanying drawings described below, where similar reference numerals indicate similar elements, but not limited thereto, in which:

FIG. 4 illustrates an example in which an address range associated with a cache pool is changed;

FIG. 5 illustrates another example in which an address range associated with a cache pool is changed;

FIG. 6 illustrates an example in which an address range associated with a cache pool and a cache allocation capacity are changed;

DETAILED DESCRIPTION

Figure 1:
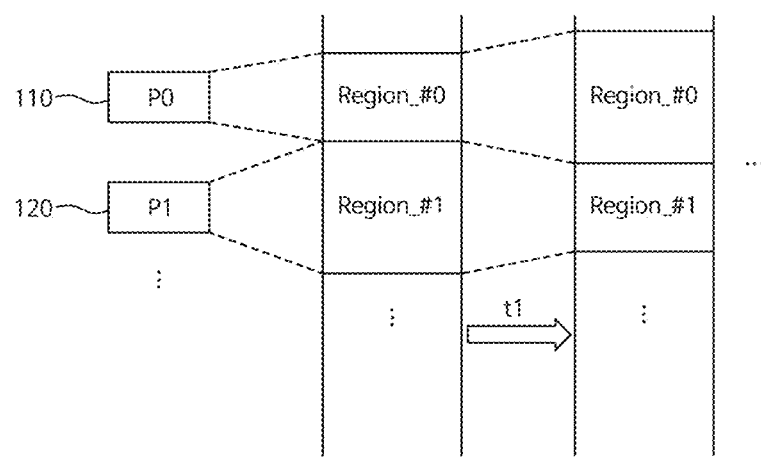
FIG. 1 illustrates an example in which a cache pool is adaptively adjusted.

Hereinafter, example details for the practice of the present disclosure will be described in detail with reference to the accompanying drawings. However, in the following description, detailed descriptions of well-known functions or configurations will be omitted if it may make the subject matter of the present disclosure rather unclear.

In the accompanying drawings, the same or corresponding components are assigned the same reference numerals. In addition, in the following description of various examples, duplicate descriptions of the same or corresponding components may be omitted. However, even if descriptions of components are omitted, it is not intended that such components are not included in any example.

Advantages and features of the disclosed examples and methods of accomplishing the same will be apparent by referring to examples described below in connection with the accompanying drawings. However, the present disclosure is not limited to the examples disclosed below, and may be implemented in various forms different from each other, and the examples are merely provided to make the present disclosure complete, and to fully disclose the scope of the disclosure to those skilled in the art to which the present disclosure pertains.

The terms used herein will be briefly described prior to describing the disclosed example(s) in detail. The terms used herein have been selected as general terms which are widely used at present in consideration of the functions of the present disclosure, and this may be altered according to the intent of an operator skilled in the art, related practice, or introduction of new technology. In addition, in specific cases, certain terms may be arbitrarily selected by the applicant, and the meaning of the terms will be described in detail in a corresponding description of the example(s). Therefore, the terms used in the present disclosure should be defined based on the meaning of the terms and the overall content of the present disclosure rather than a simple name of each of the terms.

As used herein, the singular forms "a," "an," and "the" are intended to include the plural forms as well, unless the context clearly indicates the singular forms. Further, the plural forms are intended to include the singular forms as well, unless the context clearly indicates the plural forms. Further, throughout the description, when a portion is stated as "comprising (including)" a component, it is intended as meaning that the portion may additionally comprise (or include or have) another component, rather than excluding the same, unless specified to the contrary.

Further, the term "module" or "unit" used herein refers to a software or hardware component, and "module" or "unit" performs certain roles. However, the meaning of the "module" or "unit" is not limited to software or hardware. The "module" or "unit" may be configured to be in an addressable storage medium or configured to play one or more processors. Accordingly, as an example, the "module" or "unit" may include components such as software components, object-oriented software components, class components, and task components, and at least one of processes, functions, attributes, procedures, subroutines, program code segments, drivers, firmware, micro-codes, circuits, data, database, data structures, tables, arrays, and variables. Furthermore, functions provided in the components and the "modules" or "units" may be combined into a smaller number of components and "modules" or "units", or further divided into additional components and "modules" or "units."

The "module" or "unit" may be implemented as a processor and a memory. The "processor" should be interpreted broadly to encompass a general-purpose processor, a central processing unit (CPU), a microprocessor, a digital signal processor (DSP), a controller, a microcontroller, a state machine, and so forth. Under some circumstances, the "processor" may refer to an application-specific integrated circuit (ASIC), a programmable logic device (PLD), a field-programmable gate array (FPGA), and so on. The "processor" may refer to a combination for processing devices, e.g., a combination of a DSP and a microprocessor, a combination of a plurality of microprocessors, a combination of one or more microprocessors in conjunction with a DSP core, or any other combination of such configurations. In addition, the "memory" should be interpreted broadly to encompass any electronic component that is capable of storing electronic information. The "memory" may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or marking data storage, registers, and so on. The memory is said to be in electronic communication with a processor if the processor can read information from and/or write information to the memory. The memory integrated with the processor is in electronic communication with the processor.

In addition, terms such as first, second, A, B, (a), (b), etc. used in the following examples are only used to distinguish certain components from other components, and the nature, sequence, order, etc. of the components are not limited by the terms.

In addition, in the following examples, if a certain component is stated as being "connected," "combined" or "coupled" to another component, it is to be understood that there may be yet another intervening component "connected," "combined" or "coupled" between the two components, although the two components may also be directly connected or coupled to each other.

In addition, as used in the following examples, "comprise" and/or "comprising" does not foreclose the presence or addition of one or more other elements, steps, operations, and/or devices in addition to the recited elements, steps, operations, or devices.

Before describing various examples of the present disclosure, terms used will be described.

In the embodiments of the present disclosure, "instructions" may refer to a series of computer readable instructions grouped based on functions, and to a component of a computer program being executed by a processor.

In the embodiments of the present disclosure, a "cache region" is a region associated with the cache pool and may include at least one of an address range of a main memory or a storage region (capacity) of a cache memory.

Hereinafter, various examples of the present disclosure will be described in detail with reference to the accompanying drawings.

FIG. 1 illustrates an example in which cache pools 110 and 120 are adaptively adjusted. Referring to FIG. 1, the cache memory may be divided into a plurality of cache pools 110 and 120. In FIG. 1, the cache memory is illustrated as being divided into two or more cache pools 110 and 120.

Different cache regions (Region_#0 and Region_#1) may be allocated to each of the divided cache pools 110 and 120. Here, the cache regions (Region_#0, Region_#1) may include an address range of a main memory and/or a storage region (capacity) of a cache memory. The address range of the main memory may relate to a region of the main memory allocated to a specific cache pool, and the storage region (capacity) of the cache memory may be related to a portion of the capacity of the cache memory allocated to a specific cache pool out of the total capacity of the cache memory.

For example, the first cache region (Region_#0) allocated to the first cache pool 110 may include a first address range from first to second address of the main memory and/or a first storage region of a cache memory having a first capacity. As another example, the second cache region (Region_#1) allocated to the second cache pool 120 may include a second address range from third to fourth address of the main memory and/or a second storage region of a cache memory having a second capacity.

Each of the plurality of cache pools 110 and 120 may be associated with workload. For example, the first cache pool 110 may be associated with a first workload, and the second cache pool 120 may be associated with a second workload. In addition, a plurality of workloads may be workloads associated with different data structures (e.g., Queue, Stack, Array, Tree, etc.). For example, the first workload may be associated with a first data structure and the second workload may be associated with a second data structure. Accordingly, each of the cache pools 110 and 120 may be accessed by the workloads associated with different data structures. For example, if the first workload associated with the first data structure is performed, the first cache region (Region_#0) associated with the first cache pool 110 may be accessed, and if the second workload associated with the second data structure is performed, the second cache region (Region_#1) associated with the second cache pool 120 may be accessed. In this case, if a process related to the first workload is performed, required data may be first accessed in the first storage region of the cache memory allocated to the first cache region (Region_#0). If required data is not in the first storage region, the required data may be accessed from the main memory region corresponding to the first address range of the main memory allocated to the first cache region (Region_#0).

Monitoring information on the cache memory is collected periodically or aperiodically, and the cache region (Region_#0, Region_#1) allocated to each of the cache pools 110 and 120 may be adjusted based on the collected monitoring information to increase the cache hit rate. A memory access pattern associated with each workload may be estimated based on the monitoring information, and whether to adjust the cache regions (Region_#0, Region_#1) and its adjustment range may be determined based on the estimated memory access pattern for each workload. Here, the memory access pattern may include an access pattern for at least one of the main memory and the cache memory. In an example to be described below, it is exemplified that the memory access pattern includes the access pattern for the main memory, but embodiments are not limited thereto and it goes without saying that the memory access pattern may include access pattern for the cache memory.

Figure 10:
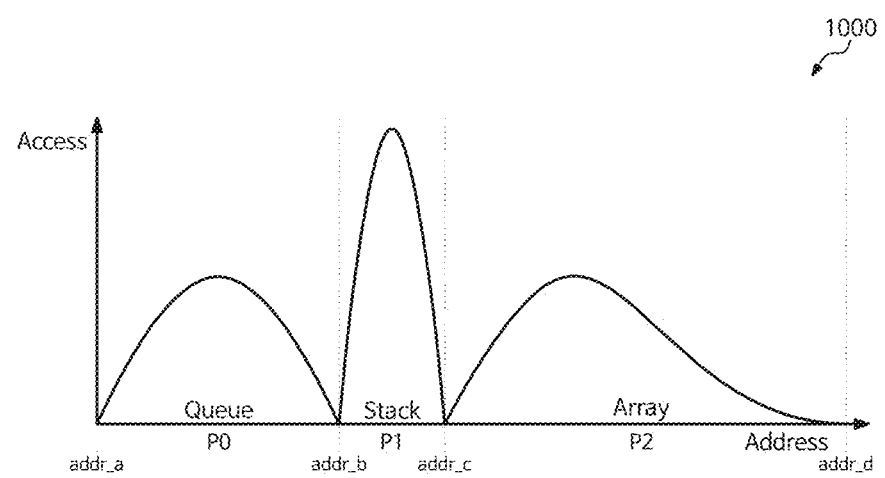
FIG. 10 illustrates a memory access pattern for each workload.

The memory access pattern may include an access probability/frequency to the address range of main memory for each workload (see FIG. 10). As illustrated in FIG. 1, cache regions (Region_#0 and Region_#1) allocated to the cache pools 110 and 120 may be adjusted based on the memory access pattern for each workload after a period t1. FIG. 1 illustrates that the first cache region (Region_#0) allocated to the first cache pool 110 is expanded after the period t1. Here, expansion of the first cache region (Region_#0) may mean that the address range of the main memory associated with the first cache region (Region_#0) is expanded and/or the cache memory capacity associated with the first cache region (Region_#0) is expanded. In addition, FIG. 1 illustrates that the second cache region (Region_#1) allocated to the second cache pool 120 is reduced after the period t1. Reduction of the second cache region (Region_#1) may mean that the address range of the main memory associated with the second cache region (Region_#1) is reduced and/or the cache memory capacity associated with the second cache region (Region_#1) is reduced. According to the memory access pattern, in order to increase the cache hit-rate, the address range of the main memory associated with a specific cache region may be expanded and also the associated cache memory capacity may be reduced. Likewise, according to the memory access pattern, the address range of the main memory associated with a specific cache region may be reduced and also the capacity of the cache memory associated therewith may be expanded so as to increase the cache hit-rate.

Figure 2:
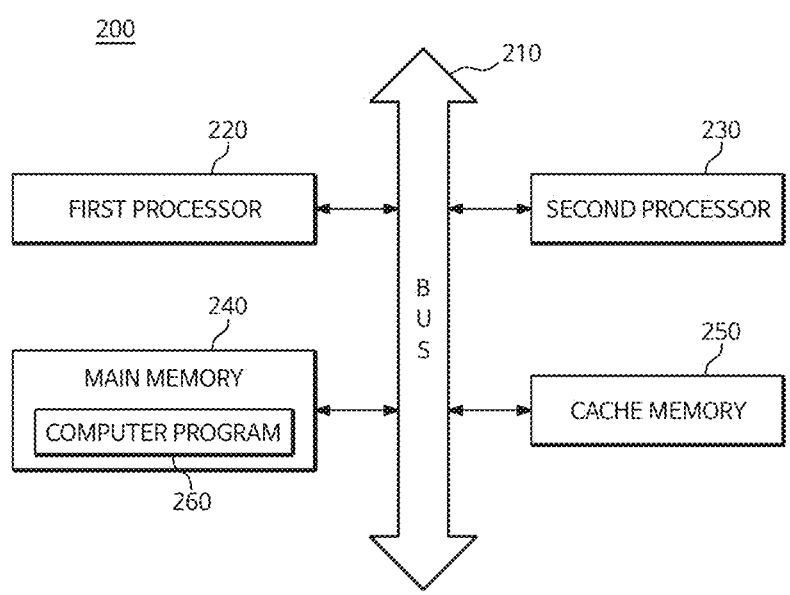
FIG. 2 is a configuration diagram of a computing device for an adaptive cache pool management method.

FIG. 2 is a configuration diagram of a computing device 200 for an adaptive cache pool management method. For example, the computing device 200 may be related to a server, a user terminal, a personal computer, a portable computer, etc. The computing device 200 may include a domain specific architecture (DSA) processor (e.g., a first processor 220) designed to more efficiently drive a specific application. In the case of DSA, more information on user workload may be specified, and resource efficiency of the cache can be improved by utilizing this. However, even for DSA, there are not one or two applications to be executed, and it is very inefficient to check all algorithms, establish a caching strategy for each workload (data structure), and reflect it in the System on Chip (SoC) structure. In order to overcome problems described above, a second processor 230 may estimate the memory access pattern for each workload (data structure) and allocate more resources to regions with a high access probability according to the estimated access pattern, thereby obtaining high cache efficiency. That is, the second processor 230 may automatically set each cache region in accordance with an access pattern for each workload (data structure) to obtain high cache efficiency. This is based on the premise that the access probability to each memory address is not the same and the access characteristics of each region are different.

As illustrated, the computing device 200 may include a bus 210, the first processor 220, the second processor 230, a main memory 240 and a cache memory 250. A computer program 260 may be loaded into the main memory 240. FIG. 2 illustrates only components related to a specific example. Accordingly, those of ordinary skill in the art to which the present disclosure pertains will be able to recognize that other general-purpose components may be further included in addition to the components illustrated in FIG. 2. For example, the computing device 200 may further include a storage, a communication interface, etc.

The bus 210 may provide a communication function between components of the computing device 200. The bus 210 may be implemented as various types of buses such as an address bus, a data bus, a control bus, etc.

The first processor 220 as a main processor may control overall operations of each component of the computing device 200. The first processor 220 may be a Central Processing Unit (CPU), a Graphic Processing Unit (GPU), a Tensor Processing Unit (TPU), a Micro Processor Unit (MPU), a Micro Controller Unit (MCU), or any type of processor well known in the art of the present disclosure. In addition, the first processor 220 may access the cache memory 250 and/or the main memory 240 to read or write data. The first processor 220 may attempt to acquire required data by first accessing the cache memory 250 and, if the required data is not stored in the cache memory 250, may acquire the required data by accessing the main memory 240. The first processor 220 may perform an operation on the computer program 260 loaded in the main memory 240. For example, the first processor 220 may execute an application associated with the computer program 260.

The main memory 240 may store various data, instructions and/or information. The main memory 240 may load one or more computer programs 260 from a storage (not illustrated) to execute methods/operations according to various examples of the present disclosure. The main memory 240 may be implemented as a volatile memory such as RAM, but the aspects of the present disclosure are not limited thereto.

The cache memory 250 may be a memory for supporting high-speed data processing. FIG. 2 illustrates the cache memory 250 as being separated from the first processor 220, but the cache memory 250 may be included in the first processor 220. The cache memory 250 may be divided into a plurality of cache pools. That is, the cache memory 250 may be based on a pooled cache structure. The divided cache pools may be adaptively adjusted based on the monitoring information of the cache memory 250.

The second processor 230 may be a processor for managing a cache pool, that is, a cache control processor. For example, the second processor 230 may include a microprocessor unit (MPU), a microcontroller unit (MCU), or any type of processor well known in the art. As another example, the second processor 230 may be a processor including FPGA and/or ASIC. The second processor 230 may include firmware storing a computer program to perform operations/methods according to various examples of the present disclosure. The second processor 230 may execute instructions related to a computer program stored in firmware to perform operations/methods according to various examples of the present disclosure. Additionally or alternatively, the second processor 230 may load the computer program 260 included in the storage into the main memory 240 and execute instructions included in the loaded computer program 260.

Additionally or alternatively, the first processor 220 may manage the cache pool. For example, the computer program 260 may include one or more instructions that, when loaded into the main memory 240, cause the first processor 220 to perform operations/methods according to various examples of the present disclosure. That is, the first processor 220 may execute one or more instructions included in the computer program 260 to perform operations/methods according to various examples of the present disclosure.

Additionally, the computer program 260 may include one or more instructions associated with an application. The first processor 220 may execute one or more instructions associated with the application so as to execute and control the application. The main memory address range to which the cache is allocated or the storage region (capacity) of the cache memory may be determined based on the type of application, and based on this, the cache memory 250 may be divided into a plurality of cache pools immediately before or immediately after the application is executed. Additionally or alternatively, initially (e.g., upon application execution), the cache memory 250 may be divided into a plurality of pools at regular intervals. Additionally or alternatively, initially (e.g., upon application execution), the cache memory 250 may be randomly divided into a plurality of pools. The plurality of pools of the cache memory 250 may be periodically/aperiodically adjusted based on the access patterns for each of the plurality of workloads (data structures).

Figure 3:
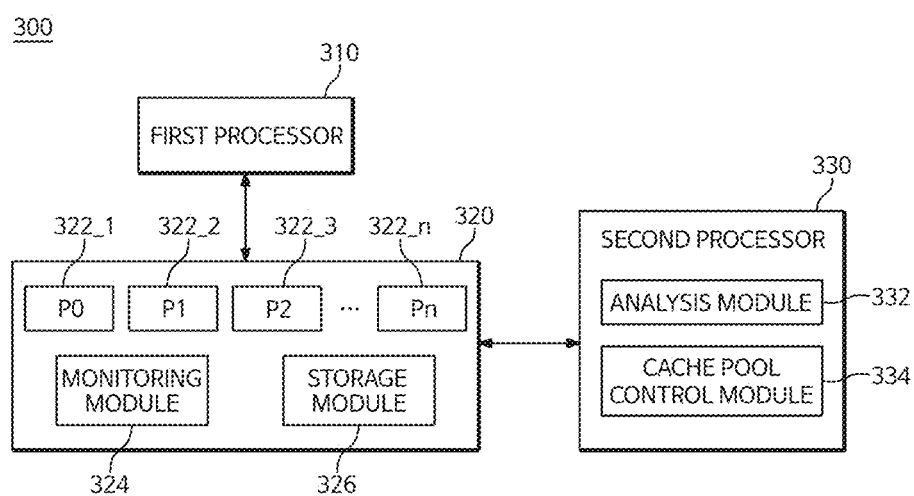
FIG. 3 is a block diagram illustrating internal configurations of a cache memory and a second processor of a computing device.

FIG. 3 is a block diagram illustrating internal configurations of a cache memory 320 and a second processor 330 of a computing device 300. As illustrated in FIG. 3, the cache memory 320 may include a plurality of divided cache pools 322_1 to 322_n, a monitoring module 324 and a storage module 326. In addition, the second processor 330 may include an analysis module 332 and a cache pool control module 334.

The first processor 310 may attempt to acquire required data by first accessing the cache memory 320, and if the required data is not stored in the cache memory 320, may acquire the required data by accessing the main memory.

Different cache regions may be allocated to each of the plurality of cache pools 322_1 to 322_n. The cache region may include an address range of the main memory and/or a storage region (address range or capacity) of the cache memory 320. The number of cache pools 322_1 to 322_n may correspond to the number of workloads (data structures). In addition, the plurality of workloads may be workloads associated with different data structures. For example, if there are four workloads, the number of cache pools 322_1 to 322_n may also be four. One workload may be associated with one cache pool. For example, if each of a plurality of workloads is associated with tree, queue, stack, array, and other data structures, the cache memory 320 may be divided into five cache pools, in which the first cache pool may be associated with the tree data structure, the second cache pool may be associated with the queue data structure, the third cache pool may be associated with the stack data structure, the fourth cache pool may be associated with the array data structure, and the fifth cache pool may be associated with the other data structures.

The storage module 326 may be a storage device for storing monitoring information for the cache memory 320. For example, the storage module 326 may include at least one register. As another example, a portion of the entire storage region included in the cache memory 320 may be allocated for the storage module 326.

The monitoring module 324 may monitor the access by the first processor 310 to each of a plurality of cache pools 322_1 to 322_n, and store monitoring information including a plurality of access logs and hit rates for each cache in the storage module 326. Here, the monitoring information may include at least one of an access log to an address associated with each of the plurality of cache pools 322_1 to 322_n, or a cache hit-rate. The monitoring module 324 may determine whether the memory from which the first processor 310 acquires required data is a cache memory or a main memory, and calculate a cache hit rate for each cache pool 322_1 to 322_n based on the determination result.

The monitoring module 324 may generate a plurality of access logs during a predetermined period and include the access logs in the monitoring information. Main memory addresses and/or cache memory addresses accessed by the first processor 310 may be recorded in the access log, and a plurality of access logs corresponding to the number of accesses may be included in the monitoring information.

The analysis module 332 included in the second processor 330 may access the storage module 326 included in the cache memory 320 to acquire at least one piece of monitoring information. For example, the analysis module 332 may acquire at least one piece of monitoring information included in the storage module 326 at predetermined periodic intervals or in real time. The monitoring information acquired by the analysis module 332 may be erased from the storage module 326.

The analysis module 332 may estimate a memory access pattern for each of a plurality of workloads based on the monitoring information. For example, the analysis module 332 may use K-means clustering, deep learning algorithms, etc. to estimate the memory access pattern of each workload (data structure) based on the monitoring information, and set the cache region based on the result. For example, the memory access pattern may include an estimated probability or frequency of main memory (or cache memory) access for each of a plurality of workloads (data structures).

The analysis module 332 may input the monitoring information to a machine learning model and acquire a memory access pattern for each workload output from the machine learning model. A program associated with the machine learning model may be stored in a storage included in the computing device. The machine learning model will be described below with reference to FIGS. 7 to 9.

The analysis module 332 may apply the clustering algorithm to the monitoring information to estimate a memory access pattern for each of a plurality of workloads. For example, the analysis module 332 may use the K-means clustering algorithm, Mean-Shift Clustering algorithm, Gaussian Mixture Model (GMM), and Density-Based Spatial Clustering of Applications with Noise (BSCAN), etc. to estimate the memory access patterns for each of a plurality of workloads.

The cache pool control module 334 may adjust a cache region associated with at least one of the plurality of cache pools, based on the memory access pattern for each workload estimated by the analysis module 332. The cache pool control module 334 may determine a target cache pool to change a cache region based on the memory access pattern for each of the estimated plurality of workloads, and change the cache region associated with the determined target cache pool.

For example, the cache pool control module 334 may determine an address range for each workload based on the memory access pattern. In addition, the cache pool control module 334 may adjust a cache region associated with at least one of the plurality of cache pools based on the determined address range for each workload. In this case, the cache pool control module 334 may perform instructions for widening/narrowing the main memory range for the cache pool, and/or instructions for allocating more/less of a predetermined cache memory capacity to a specific cache pool, so as to adjust the cache region associated with the specific cache pool.

Referring to FIGS. 4 to 6, various examples in which a cache region of each cache pool is changed will be described. It should be understood that the address range and cache memory capacity of the main memory illustrated in FIGS. 4 to 6 are examples for easier understanding of various examples of the present disclosure.

FIG. 4 illustrates an example in which an address range associated with a cache pool is changed. FIG. 4 illustrates that the address range of the main memory is allocated to each cache pool.

According to a first cache pool table 410, the same address range may be allocated to each of cache pools P0 to P3. That is, an address range having 10,000 addresses may be allocated to each of the cache pools P0 to P3.

As illustrated in a second cache pool table 420, based on the monitoring information on the cache memory collected during the period t1, the address range of the main memory allocated to the first cache pool P0 may be reduced, and the address range of the main memory allocated to the second cache pool P1 may be expanded. Then, as illustrated in a third cache pool table 430, based on the monitoring information on the cache memory collected during a period t2, the address range of the main memory allocated to the third cache pool P2 may be reduced, and the address range of the main memory allocated to the fourth cache pool P3 may be expanded.

FIG. 5 illustrates another example in which an address range associated with a cache pool is changed. FIG. 5 illustrates that the address range of the main memory is allocated to each cache pool, and also illustrates that a non-linear address range can be allocated to the cache pool.

Referring to FIG. 5, the same address range may be allocated to each of the cache pools P0 to P3 included in a first cache pool table 510. As illustrated in a second cache pool table 520, based on the monitoring information on the cache memory collected during the period t1, the address range of the main memory allocated to the first cache pool P0 may be reduced, and the address range of the main memory allocated to the fourth cache pool P3 may be expanded. As illustrated in the second cache pool table 520, the address range (addr #5001 to addr #10000) removed from the first cache pool P0 may be additionally allocated to the fourth cache pool P3, so that the fourth cache pool P3 may be allocated a non-linear address range, that is, a first address range from addr #5001 to addr #10000 and a second address range from addr #30001 to addr #40000.

Then, as illustrated in a third cache pool table 530, based on the monitoring information on the cache memory collected during the period t2, the address range of the main memory allocated to the second cache pool P1 may be reduced, and the address range of the main memory allocated to the third cache pool P2 may be expanded.

FIG. 6 illustrates an example in which an address range associated with a cache pool and a cache allocation capacity are changed. FIG. 6 illustrates that the address range of the main memory and the capacity of the cache memory (that is, the storage region of the cache memory) are allocated to each cache pool.

The address range of the main memory and the capacity of the cache memory may be allocated to each of the cache pools P0 to P3 included in a first cache pool table 610. It is illustrated that the same address range of main memory and cache memory of the same capacity (1 Mbyte) are allocated to each cache pool (P0 to P3) in the first cache pool table 610.

As illustrated in a second cache pool table 620, based on the monitoring information on the cache memory collected during the period t1, the address of the main memory allocated to at least one cache pool and the cache memory capacity may be adjusted. It is illustrated that in the second cache pool table 620 of FIG. 6, the address range of the main memory allocated to the first cache pool P0 is reduced, and the address range of the main memory allocated to the second cache pool P1 is expanded. Additionally, it is illustrated that the cache memory capacity allocated to the first cache pool P0 is reduced and the cache memory capacity of the main memory allocated to the second cache pool P2 is expanded.

The cache memory capacity may be allocated to the cache pool in proportion to the allocated address range. In this case, if the address range of a specific cache pool is changed, the cache memory capacity may be changed in proportion to the changed address range. Alternatively, the cache memory capacity may be independently allocated regardless of the range of addresses allocated to the cache pool, and also adaptively adjusted.

As illustrated in a third cache pool table 630, based on the monitoring information on the cache memory collected during the period t2, the address range of the main memory and the cache memory capacity allocated to the third cache pool P2 may be reduced, and the address range of the main memory and the cache memory capacity allocated to the fourth cache pool P3 may be expanded.

As described above, the cache region associated with each cache pool may be adaptively adjusted based on the monitoring information of the cache memory.

Figure 7:
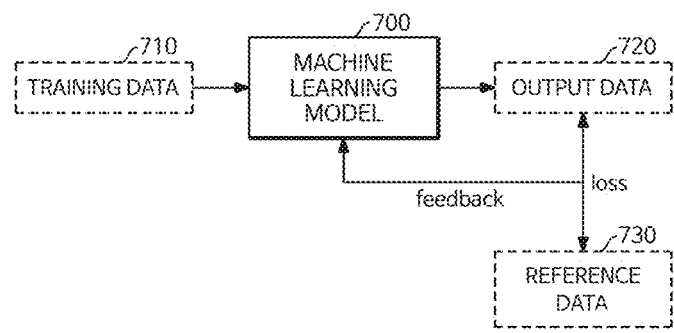
FIG. 7 is a diagram provided to explain a method for training a machine learning model.
Figure 8:
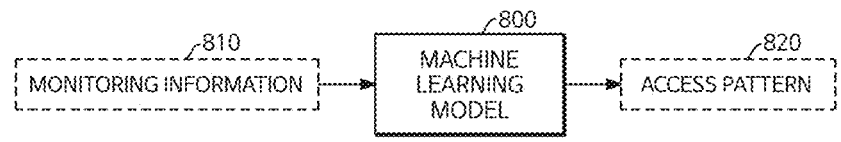
FIG. 8 illustrates a method for outputting a memory access pattern output through a machine learning model.
Figure 9:
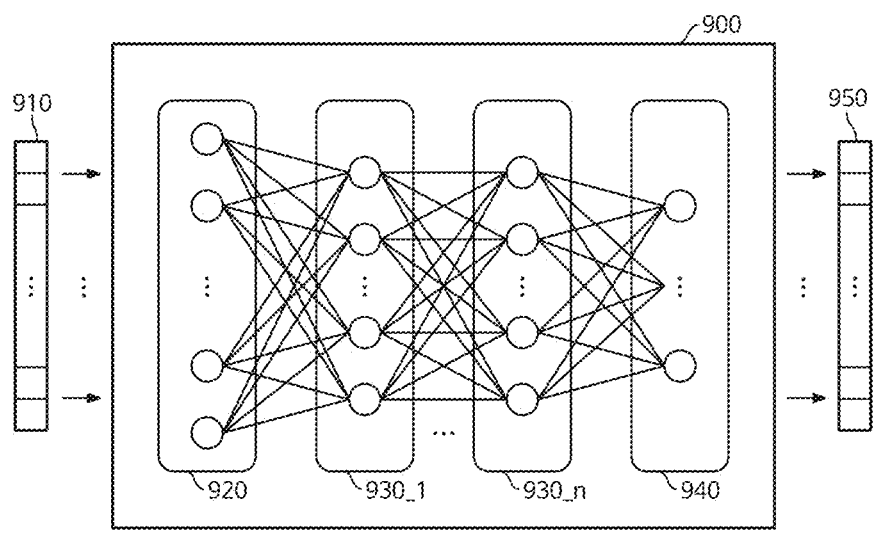
FIG. 9 is an exemplary diagram illustrating an artificial neural network model.

Referring to FIGS. 7 to 9, a machine learning model applied to the present disclosure will be described.

FIG. 7 is a diagram provided to explain a method for training a machine learning model 700. FIG. 7 may be an example of supervised learning. First, a training set including a plurality of training data and a plurality of reference data may be generated. The reference data may be used as a ground truth of the training data. Here, the reference data may include a memory access pattern for each workload (data structure), and the memory access pattern may include an address range for the main memory. In addition, the training data may include the monitoring information. The workload may be a workload associated with a specific data structure, and one workload may be associated with one cache pool.

The training data and reference data included in the training set may be generated based on test data for the cache memory. For example, with the cache memory divided into a plurality of cache pools based on the number of workloads, an application may be executed and the cache hit-rate generated in each cache pool may be measured. In addition, during a test of the cache memory, a cache region allocated to a plurality of cache pools may be changed such that a cache hit-rate for each cache pool may be measured. A plurality of reference data associated with a plurality of training data may be generated based on a change trend of the cache region allocated to the cache pool and a change trend of the cache hit-rate.

As illustrated in FIG. 7, training data 710 may be input to the machine learning model 700, and the machine learning model 700 may output output data 720 based on the training data 710. The output data 720 may include a memory access pattern for each workload. A loss value between reference data 730 and the output data 720 associated with the training data 710 may be calculated. The loss value between the reference data 730 and the output data 720 may be calculated using various functions for calculating the loss value. As another example, a matching ratio between a memory access pattern for each workload included in the reference data 730 and a memory access pattern for each workload included in the output data 720 may be calculated as a loss value. The loss value is fed back to the machine learning model 700, and the weight of at least one node included in the machine learning model 700 may be adjusted.

Training data as many as the number of training data included in the training set is sequentially input to the machine learning model 700, and the machine learning model 700 may be repeatedly trained. In addition, already learned training data is input again to the machine learning model 700, and the machine learning model 700 may be repeatedly trained based on the same training data. With repeated training, the weight of at least one node included in the machine learning model 700 may converge to an optimal value.

FIG. 8 illustrates a method for outputting a memory access pattern 820 output through a machine learning model 800. The machine learning model 800 illustrated in FIG. 8 may be a model repeatedly trained a predetermined number of times or more. As illustrated in FIG. 8, monitoring information 810 may be input to the machine learning model 800, and the machine learning model 800 may output the memory access pattern 820 for each workload based on the monitoring information 810. An example of the memory access pattern 820 is illustrated in FIG. 10. The second processor may determine whether or not to adjust a cache region associated with at least one cache pool based on the memory access pattern 820 for each workload.

A computer program related to the machine learning model 800 may be loaded into at least one of main memory, cache memory, or firmware. For example, a computer program associated with the machine learning model 800 may be stored in firmware included in an auxiliary processor (e.g., the second processor 230 of FIG. 2). In this case, an algorithm based on the machine learning model 800 may be performed based on the computer program stored in firmware. As another example, the computer program associated with the machine learning model 800 is stored in storage, and the computer program stored in the storage may be loaded into the main memory, and the machine learning model 800 may be operated based on the computer program loaded into the main memory by the second processor and/or the first processor.

FIG. 9 is an exemplary diagram illustrating an artificial neural network model 900. In machine learning technology and cognitive science, the artificial neural network model 900 as an example of the machine learning model may refer to a statistical learning algorithm implemented based on a structure of a biological neural network, or to a structure that executes such algorithm.

The artificial neural network model 900 may represent a machine learning model that acquires a problem solving ability by repeatedly adjusting the weights of synapses by the nodes that are artificial neurons forming the network through synaptic combinations as in the biological neural networks, thus training to reduce errors between a target output corresponding to a specific input and a deduced output. For example, the artificial neural network model 900 may include any probability model, neural network model, and the like, that is used in artificial intelligence learning methods such as machine learning and deep learning.

The artificial neural network model 900 may include an artificial neural network model configured to infer a memory access pattern for each workload having a high cache hit rate by using the monitoring information about the cache memory.

The artificial neural network model 900 may be implemented as a multi-layer perceptron (MLP) formed of multi-layer nodes and connections between them. The artificial neural network model 900 may be implemented using one of various artificial neural network model structures including the MLP. As illustrated in FIG. 9, the artificial neural network model 900 may include an input layer 920 to receive an input signal or data 910 from the outside, an output layer 940 to output an output signal or data 950 corresponding to the input data, and (n) number of hidden layers 930_1 to 930_n (where n is a positive integer) positioned between the input layer 920 and the output layer 940 to receive a signal from the input layer 920, extract the features, and transmit the features to the output layer 940. In an example, the output layer 940 may receive signals from the hidden layers 930_1 to 930_n and output data to the outside.

The method of training the artificial neural network model 900 includes the supervised learning that trains to optimize for solving a problem with inputs of teacher signals (correct answers), and the unsupervised learning that does not require a teacher signal. The artificial neural network model 900 may be trained by the supervised and/or unsupervised learning to infer the memory access pattern for each workload. The computer program associated with the artificial neural network model 900 thus trained may be stored in the computing device.

As described above, the input layer 920 and the output layer 940 of the artificial neural network model 900 are respectively matched with a plurality of output data corresponding to a plurality of input data, and the synaptic values between nodes included in the input layer 920, and the hidden layers 930_1 to 930_n, and the output layer 940 are adjusted, so that training can be processed to extract a correct output corresponding to a specific input. Through this training process, the features hidden in the input data of the artificial neural network model 900 may be confirmed, and the synaptic values (or weights) between the nodes of the artificial neural network model 900 may be adjusted so as to reduce the errors between the output data calculated based on the input data and the target output. The artificial neural network model 900 trained as described above may output an access pattern for each workload that increases the cache hit-rate in response to input data.

FIG. 10 illustrates a memory access pattern 1000 for each workload. FIG. 10 illustrates that each workload is a workload associated with a specific data structure. The memory access pattern 1000 for each workload as illustrated in FIG. 10 may be acquired from the machine learning model. As another example, the memory access pattern 1000 for each workload may be acquired based on a clustering algorithm, etc.

In the illustration of FIG. 10, the X axis may be related to the address range of the main memory, and the Y axis may be related to access frequency/probability. In the illustrated example, it can be seen that the specific memory address included in the second workload (stack) is accessed with the highest frequency, but the width of the address range included in the second workload (stack) is the narrowest. In addition, referring to FIG. 10, it can be seen that the width of the address range related to the third load (Array) is the widest.

The first processor and/or the second processor may adjust at least one cache region related to each cache pool P0 to P2 to correspond to the address range included in the estimated memory access pattern 1000. In the illustrated example, based on the estimated memory access pattern 1000, the auxiliary processor may allocate a (addr_a-addr_b) range of the main memory to the first cache pool P0 associated with the first data structure (Queue). Likewise, the auxiliary processor may allocate addr_b-addr_c of the main memory to the second cache pool P1 associated with the second data structure (Stack), and allocate addr_c- addr_d of the main memory to the third cache pool P2 associated with the third data structure (Array). Additionally or alternatively, the processor may adjust the cache memory capacity allocated to each pool based on the memory access pattern 1000.

With this configuration, by separating the respective data structures having different access probabilities and access patterns, a plurality of cache pools can maximize cache hit-rates without interfering with each other.

Figure 11:
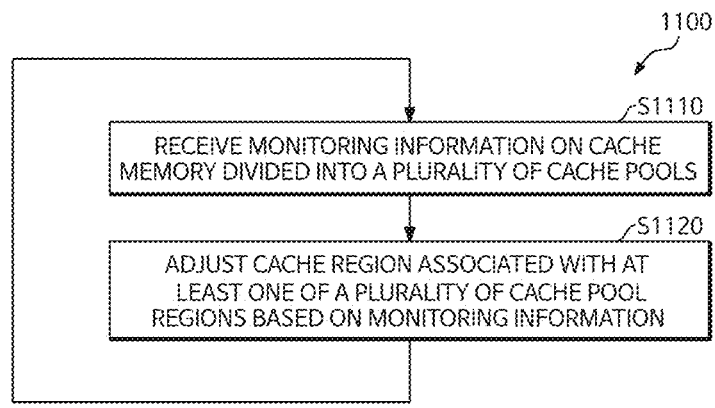
FIG. 11 is a flowchart illustrating a method for managing an adaptive cache pool.

FIG. 11 is a flowchart illustrating a method 1100 for managing an adaptive cache pool. The method illustrated in FIG. 11 is merely one example for achieving the object of the present disclosure, and it goes without saying that certain steps may be added or omitted as needed. In addition, the method illustrated in FIG. 11 may be performed by one or more processors (e.g., an auxiliary processor) included in the computing device. The method 1100 according to FIG. 11 may be repeatedly performed periodically or aperiodically. When performed periodically, for example, the method may be performed in a period of several seconds or tens of seconds. In a specific example, the cache pool adjustment based on the memory access patterns may be performed immediately if the cache hit-rate is less than or equal to a predetermined threshold.

The processor may receive the monitoring information on the cache memories divided into a plurality of cache pools, at S1110. Here, the monitoring information may include at least one of an access log to an address associated with each of a plurality of cache pools, or a cache hit-rate.

The processor may adjust a cache region associated with at least one of a plurality of cache pools based on the monitoring information, at S1120. The processor may estimate a memory access pattern for each of a plurality of workloads based on the monitoring information, and adjust the cache region associated with at least one of a plurality of cache pools based on the estimated memory access pattern for each of the plurality of workloads. For example, the memory access pattern for each of a plurality of workloads may be estimated by inputting at least some of the monitoring information to a machine learning model. As another example, the processor may estimate an access probability or frequency for each main memory address for each of a plurality of workloads based on at least some of the monitoring information.

The processor may determine a target cache pool to change a cache region based on the memory access pattern for each of a plurality of estimated workloads, and change the main memory address associated with the determined target cache pool. Additionally or alternatively, the processor may determine a target cache pool to change a cache region based on the memory access pattern for each of the estimated plurality of workloads, and change the cache memory capacity allocated to the determined target cache pool.

The plurality of workloads may be workloads associated with different data structures. For example, the cache region associated with the plurality of cache pools may be adjusted such that different data structures are associated with different cache pools.

The monitoring information for the cache memory may be received periodically or aperiodically, and the cache region associated with the plurality of cache pools may be adjusted periodically or aperiodically using the received monitoring information.

The processor may acquire a type of application requested to be executed, and divide the cache memory into a plurality of cache pools based on the acquired type of the application.

To this end, the cache pool information for each application type may be stored in the computing device. The cache pool information may include an address of a main memory and/or a cache memory capacity allocated for each cache pool. For example, a first cache pool information associated with a first application type may be stored in the computing device, and a second cache pool information associated with a second application type may be stored in the computing device. If a request to execute an application is detected, the processor may acquire the type of the requested application and extract cache pool information associated with the acquired type of the application. The processor may divide the cache memory into a plurality of cache pools to correspond to the address range of the main memory and/or the capacity of the cache memory of each of the plurality of cache pools included in the extracted cache pool information.

The flowchart and description described above are merely examples, and may be implemented differently in some examples. For example, in some examples, the order of respective steps may be changed, some steps may be repeatedly performed, some steps may be omitted, or some steps may be added.

The method described above may be provided as a computer program stored in a computer-readable recording medium for execution on a computer. The medium may be a type of medium that continuously stores a program executable by a computer, or temporarily stores the program for execution or download. In addition, the medium may be a variety of recording means or storage means having a single piece of hardware or a combination of several pieces of hardware, and is not limited to a medium that is directly connected to any computer system, and accordingly, may be present on a network in a distributed manner. An example of the medium includes a medium configured to store program instructions, including a magnetic medium such as a hard disk, a floppy disk, and a magnetic tape, an optical medium such as a CD-ROM and a DVD, a magnetic-optical medium such as a floptical disk, and a ROM, a RAM, a flash memory, and so on. In addition, other examples of the medium may include an app store that distributes applications, a site that supplies or distributes various software, and a recording medium or a storage medium managed by a server.

The methods, operations, or techniques of the present disclosure may be implemented by various means. For example, these techniques may be implemented in hardware, firmware, software, or a combination thereof. Those skilled in the art will further appreciate that various illustrative logical blocks, modules, circuits, and algorithm steps described in connection with the disclosure herein may be implemented in electronic hardware, computer software, or combinations of both. To clearly illustrate this interchangeability of hardware and software, various illustrative components, blocks, modules, circuits, and steps have been described above generally in terms of their functionality. Whether such a function is implemented as hardware or software varies depending on design requirements imposed on the particular application and the overall system. Those skilled in the art may implement the described functions in varying ways for each particular application, but such implementation should not be interpreted as causing a departure from the scope of the present disclosure.

In a hardware implementation, processing units used to perform the techniques may be implemented in one or more ASICs, DSPs, digital signal processing devices (DSPDs), programmable logic devices (PLDs), field programmable gate arrays (FPGAs), processors, controllers, microcontrollers, microprocessors, electronic devices, other electronic units designed to perform the functions described in the present disclosure, computer, or a combination thereof.

Accordingly, various example logic blocks, modules, and circuits described in connection with the present disclosure may be implemented or performed with general purpose processors, DSPs, ASICs, FPGAs or other programmable logic devices, discrete gate or transistor logic, discrete hardware components, or any combination of those designed to perform the functions described herein. The general purpose processor may be a microprocessor, but in the alternative, the processor may be any related processor, controller, microcontroller, or state machine. The processor may also be implemented as a combination of computing devices, for example, a DSP and microprocessor, a plurality of microprocessors, one or more microprocessors associated with a DSP core, or any other combination of the configurations.

In the implementation using firmware and/or software, the techniques may be implemented with instructions stored on a computer-readable medium, such as random access memory (RAM), read-only memory (ROM), non-volatile random access memory (NVRAM), programmable read-only memory (PROM), erasable programmable read-only memory (EPROM), electrically erasable PROM (EEPROM), flash memory, compact disc (CD), magnetic or marking data storage devices, etc. The instructions may be executable by one or more processors, and may cause the processor(s) to perform certain aspects of the functions described in the present disclosure.

If implemented in software, the techniques described above may be stored on a computer-readable medium as one or more instructions or codes, or may be sent via a computer-readable medium. The computer-readable media include both the computer storage media and the communication media including any medium that facilitates the transmission of a computer program from one place to another. The storage media may also be any available media that may be accessible to a computer. By way of non-limiting example, such a computer-readable medium may include RAM, ROM, EEPROM, CD-ROM or other optical disk storage, magnetic disk storage or other magnetic storage devices, or any other media that can be used to transmit or store desired program code in the form of instructions or data structures and can be accessible to a computer. In addition, any connection is properly referred to as a computer-readable medium.

For example, if the software is sent from a website, server, or other remote sources using coaxial cable, fiber optic cable, twisted pair, digital subscriber line (DSL), or wireless technologies such as infrared, wireless, and microwave, the coaxial cable, the fiber optic cable, the twisted pair, the digital subscriber line, or the wireless technologies such as infrared, wireless, and microwave are included within the definition of the medium. The disks and the discs used herein include CDs, laser disks, optical disks, digital versatile discs (DVDs), floppy disks, and Blu-ray disks, where disks usually magnetically reproduce data, while discs optically reproduce data using a laser. The combinations described above should also be included within the scope of the computer-readable media.

The software module may reside in RAM memory, flash memory, ROM memory, EPROM memory, EEPROM memory, registers, hard disk, removable disk, CD-ROM, or any other form of storage medium known. An exemplary storage medium may be connected to the processor such that the processor may read or write information from or to the storage medium. Alternatively, the storage medium may be integrated into the processor. The processor and the storage medium may exist in the ASIC. The ASIC may exist in the user terminal. Alternatively, the processor and storage medium may exist as separate components in the user terminal.

Although the examples described above have been described as utilizing aspects of the currently disclosed subject matter in one or more standalone computer systems, aspects are not limited thereto, and may be implemented in conjunction with any computing environment, such as a network or distributed computing environment. Furthermore, the aspects of the subject matter in the present disclosure may be implemented in multiple processing chips or devices, and storage may be similarly influenced across a plurality of devices. Such devices may include PCs, network servers, and portable devices.

Although the present disclosure has been described in connection with some examples herein, various modifications and changes can be made without departing from the scope of the present disclosure, which can be understood by those skilled in the art to which the present disclosure pertains. In addition, such modifications and changes should be considered within the scope of the claims appended herein.

The invention claimed is:

1. A method for managing an adaptive cache pool, performed by a processor, the method comprising:
   receiving monitoring information on a cache memory divided into a plurality of cache pools; and
   adjusting a cache region associated with at least one of the plurality of cache pools, based on the monitoring information,
   wherein;
   each cache pool of the plurality of cache pools is allocated to a different workload among a plurality of workloads;
   each workload of the plurality of workloads is associated with a different data structure among a plurality of data structures; and
   the adjusting comprises:
   adjusting, based on the monitoring information, the cache region, for at least one of the plurality of workloads.

2. The method according to claim 1, wherein the monitoring information includes at least one of an access log to an address associated with each cache pool of the plurality of cache pools, or a cache hit-rate.

3. The method according to claim 1, wherein the adjusting the cache region comprises:
   determining a target cache pool to change the cache region, based on information on the plurality of workloads associated with the data structures; and
   changing a main memory address associated with the determined target cache pool.

4. The method according to claim 1, wherein the adjusting the cache region comprises:
   determining a target cache pool to change the cache region, based on information on the plurality of workloads associated with the data structures; and
   changing a cache memory capacity allocated to the determined target cache pool.

5. The method according to claim 1, wherein cache regions associated with the plurality of cache pools are adjusted such that different data structures are associated with different cache pools.

6. The method according to claim 1, wherein the monitoring information for the cache memory is received periodically or aperiodically, and cache regions associated with the plurality of cache pools are adjusted periodically or aperiodically using the received monitoring information.

7. The method according to claim 1, further comprising:
prior to the receiving the monitoring information,
acquiring a type of an application requested to be executed; and
dividing the cache memory into the plurality of cache pools based on the type of the application.

8. A computer-readable non-transitory recording medium storing instructions for causing performance of the method according to claim 1 on a computer hardware.

9. A computing device, comprising:
a cache memory; and
a processor connected to the cache memory and configured to execute at least one computer readable program for controlling the cache memory,
wherein the at least one program includes instructions for:
receiving monitoring information on a cache memory divided into a plurality of cache pools; and
adjusting a cache region associated with at least one of the plurality of cache pools based on the monitoring information, and
wherein:
each cache pool of the plurality of cache pools is allocated to a different workload among a plurality of workloads;
each workload of the plurality of workloads is associated with a different data structure among a plurality of data structures; and
the adjusting comprises:
adjusting, based on the monitoring information, the cache region, for at least one of the plurality of workloads.

* * * * *